United States Patent
Yano

(10) Patent No.: US 7,538,368 B2
(45) Date of Patent: May 26, 2009

(54) STANDARD CELL, STANDARD CELL LIBRARY, AND SEMICONDUCTOR INTEGRATED CIRCUIT WITH SUPPRESSED VARIATION IN CHARACTERISTICS

(75) Inventor: Junichi Yano, Osaka (JP)

(73) Assignee: Panasonic Corporation, Osaka (JP)

( * ) Notice: Subject to any disclaimer, the term of this patent is extended or adjusted under 35 U.S.C. 154(b) by 91 days.

(21) Appl. No.: 11/139,783

(22) Filed: May 31, 2005

(65) Prior Publication Data

US 2005/0280031 A1 Dec. 22, 2005

(30) Foreign Application Priority Data

Jun. 16, 2004 (JP) ............................. 2004-178875

(51) Int. Cl.
*H01L 27/10* (2006.01)

(52) U.S. Cl. ...................... 257/202; 257/390; 257/401; 257/E27.07

(58) Field of Classification Search ......... 257/202–211, 257/213, 288, 368, 390, 401, E27.07, E27.105, 257/E27.106, E27.107, E27.108; 438/128–132, 438/584, 585, 587, 588, 597–601
See application file for complete search history.

(56) References Cited

U.S. PATENT DOCUMENTS

| 6,635,935 | B2 | 10/2003 | Makino | |
|---|---|---|---|---|
| 2004/0213029 | A1* | 10/2004 | Hirata et al. | 365/104 |
| 2005/0009312 | A1* | 1/2005 | Butt et al. | 438/587 |

FOREIGN PATENT DOCUMENTS

| JP | 09-289251 | 11/1997 |
|---|---|---|
| JP | 2002-026125 | 1/2002 |

* cited by examiner

*Primary Examiner*—Evan Pert
*Assistant Examiner*—Kevin Quinto
(74) *Attorney, Agent, or Firm*—McDermott Will & Emery LLP

(57) ABSTRACT

In a standard cell, at least one of transistors on either side of a transistor having gate length different from that of the other transistors are set to be always in the OFF state. This prevents influence to the operation of the standard cell even with variation in final gate dimension, suppressing variation in characteristics of the standard cell.

12 Claims, 12 Drawing Sheets

US 7,538,368 B2

STANDARD CELL, STANDARD CELL LIBRARY, AND SEMICONDUCTOR INTEGRATED CIRCUIT WITH SUPPRESSED VARIATION IN CHARACTERISTICS

CROSS REFERENCE TO RELATED APPLICATIONS

This Non-provisional application claims priority under 35 U.S.C. § 119(a) on Patent Application No. 2004-178875 filed in Japan on Jun. 16, 2004, the entire contents of which are hereby incorporated by reference.

BACKGROUND ART

The present invention relates to a standard cell used in a semiconductor integrated circuit, a standard cell library, and a semiconductor integrated circuit using it, and particularly relates to a layout structure thereof.

Conventionally, it is widespread to design a semiconductor integrated circuit by combining a plurality of functional blocks, generally called standard cells, of which height, source wiring structure, and the like are uniformed.

In association with miniaturization of semiconductor integrated circuits in recent years, a problem of variation in final dimension of various patterns arises. Especially, variation in final dimension of gates of transistors affects transistor characteristics severely. Specifically, drive strength of a transistor lowers as gate length of the transistor increases and the drive strength thereof increases as the gate length thereof reduces. When the drive strength varies, the characteristics of a standard cell vary to cause variation in characteristics of a semiconductor integrated circuit, lowering yield and reliability of the semiconductor integrated circuit.

One of factors in variation in final dimension of the transistor gates is irregularity of gate patterns. This will be explained below with reference to FIG. 8. FIG. 8 is a plan view showing one example of a conventional standard cell. As shown in FIG. 8, a conventional standard cell 800 includes: a semiconductor layer 801; a source wiring 802 provided at one end of the semiconductor layer 801; a ground wiring 803 provided at another end of the semiconductor layer 801 which faces the source wiring 802; p-type diffusion regions 804, 805 provided in the semiconductor layer 801; n-type diffusion regions 806, 807 provided in the semiconductor layer 801; gates 808, 809, 810, 811 (only a part overlaid with a diffusion region is referred to as a gate in the present description) provided on the p-type diffusion regions 804, 805; and gates 812, 813, 814, 815 provided on the n-type diffusion regions 806, 807. Herein, the p-type diffusion regions 804, 805 and the gates 808, 809, 810, 811 provided thereon compose p-channel transistors Tr808, Tr809, Tr810, Tr811, respectively, while the n-type diffusion regions 806, 807 and the gates 812, 813, 814, 815 provided thereon compose n-channel transistors Tr812, Tr813, Tr814, Tr815, respectively.

The p-channel transistor Tr808 and the p-channel transistor Tr809, for example, share the diffusion region. And some other adjacent transistor pairs share the diffusion regions. Wherein, contact vias for electrically connecting the diffusion regions, the wiring layers, and a substrate, inter-cell wirings, input/output pins, and the like, which are not shown, are provided in the standard cell 800, in addition to the elements shown in the drawing.

In the standard cell 800 shown in FIG. 8, the respective sides of the gates of the p-channel transistors 808 to 811 and of the n-channel transistors 812 to 815 are as follows in detail.

(1) No gate exists on the left side of the gate 808 of the p-channel transistor Tr808 and the gate 809 is provided on the right side thereof with a spacing S1.
(2) The gates 808, 810 are provided on the right and left sides of the gate 809 with the spacing S1, respectively.
(3) The gate 809 is provided on the left side of the gate 810 with the spacing S1 while the gate 811 is provided on the right side thereof with a spacing S2 (S2>S1).
(4) The gate 810 is provided on the left side of the upper part of the gate 811 with the spacing S2 and no gate is provided on the left side of the lower part thereof while no gate is provided on the right side thereof.
(5) No gate is provided on the left side of the gate 812 of the n-channel transistor Tr812 and the gate 813 is provided on the right side thereof with a spacing S3 (S3<S1).
(6) The gates 812, 814 are provided on the right and left sides of the gate 813 with the spacing S3, respectively.
(7) The gate 813 is provided on the left side of the gate 814 with the spacing S3 while the gate 815 is provided on the right side thereof with a spacing S4 (S4>S2).
(8) The gate 814 is provided on the left side of the upper part of the gate 815 with the spacing S4 and no gate is provided on the left side of the lower part thereof while no gate exists on the right side thereof.

As described above, the layout conditions of the gates 808 to 811 and the gate 812 to 815 are different from one another, and this is one of factors in variation in final gate dimension, that is, variation in characteristics of the standard cells.

As a conventional technique for overcoming this disadvantage, Japanese Patent Application Laid Open Publication No. 9-289251A has been proposed. FIG. 9 is a plan view showing the structure of a conventional standard cell of disclosed in Japanese Patent Application Laid Open Publication No. 9-289251A. A standard cell 900 shown in FIG. 9 includes: a source wiring 902; a ground wiring 903 provided apart from the source wiring 902 with a semiconductor layer 901 interposed therebetween; a p-type diffusion region 904 provided in the semiconductor layer 901; a n-type diffusion region 905 provided in the semiconductor layer 901; gates 906 to 912 provided on the p-type diffusion region 904; and gates 913 to 919 provided on the n-type diffusion region 905.

Out of the gates 906 to 912 and 913 to 919, the gates 907 to 909 and 911 compose p-channel transistors Tr907 to Tr909 and Tr911 in combination with the p-type diffusion region 904, respectively, while the gates 914 to 916 and 918 compose n-channel transistors Tr914 to Tr916 and Tr918 in combination with the n-type diffusion region 905, respectively.

The gates 906, 910, 912 are extended to the source wiring 902 to be connected thereto respectively through contact vias 920, 921, 922, so as to be in the OFF state. The gates 913, 917, 919 are extended to the ground wiring 903 to be connected to the ground wiring 903 through respective contact vias 923, 924, 925, so as to be in the OFF state.

In the standard cell 900 in FIG. 9, the intervals of the gates on the diffusion regions, which are irregular in the standard cell in FIG. 8, are set to be regular intervals and the transistors in the OFF state are arranged at regular intervals of the gate intervals instead of providing independent diffusion regions. As a result, the gates 907 to 911 and 914 to 918 are arranged adjacent to one another with the same spacing S1. This improves the irregularity in gate intervals, compared with the standard cell 800 shown in FIG. 8, to minimize difference in pattern density, suppressing variation in final gate dimension and variation in characteristics of the standard cell.

As another conventional technique for improving the irregularity in patterns of gates, Japanese Patent Application Laid Open Publication No. 2002-26125A has been proposed.

FIG. 10 is a plan view showing a structure of a conventional standard cell disclosed in Japanese Patent Application Laid Open Publication No. 2002-26125A. A standard cell 1000 shown in FIG. 10 includes: a source wiring 1002; a ground wiring 1002 provided apart from the source wiring 1002 with a semiconductor layer 1001 interposed therebetween; p-type diffusion regions 1004, 1005 provided in the semiconductor layer 1001; n-type diffusion regions 1006, 1007 provided in the semiconductor layer 1001; gates 1009 to 1011, and 1013 provided on the p-type diffusion regions 1004, 1005; gates 1016 to 1018, and 1020 provided on the n-type diffusion regions 1006, 1007; dummy gates 1008, 1012, 1014 provided on the respective sides of the p-type diffusion regions 1004, 1005 in the semiconductor layer 1001; dummy gates 1015, 1019, 1021 provided on the respective sides of the n-type diffusion regions 1006, 1007 in the semiconductor layer 1001.

Out of the gates, the gates 1009 to 1011, and 1013 compose p-channel transistors Tr1009 to Tr1011, and Tr1013 in combination with the p-type diffusion regions 1004, 1005 while the gates 1016 to 1018, and 1020 compose n-channel transistors Tr1016 to Tr1018, and Tr1020 in combination with the n-type diffusion regions 1006, 1007.

On the other hand, the dummy gates 1008, 1012, 1014, 1015, 1019, and 1021 are provided in a region other than the diffusion regions of the semiconductor layer 1001 and do not contribute to operation of the transistors.

In the standard cell 1000 in FIG. 10, the intervals of the gates on the diffusion regions, which are irregular in the standard cell in FIG. 8, are set to be regular and the dummy gates are provided among the gates at the same intervals as those of the gates. As a result, the gates 1009 to 1011, and 1013 and the gates 1016 to 1018, and 1020 are arranged adjacent to other gates and dummy gates with the same spacings.

Further, the gate width of the dummy gate 1012 arranged on the left side of the gate 1013 is set larger than that of the gate 1013 so that a dummy electrode is formed over the entirety on the left side of the gate 1013 with the spacing S1. The same is applied to the gate 1020. With this arrangement, the gate irregularity is further improved and the variation in final gate dimension is further suppressed, further suppressing the variation in characteristics of the standard cell.

Japanese Patent Application Laid Open Publication No. 2002-26125A discloses another conventional technique for improving the irregularity in pattern of gates. FIG. 11 is a plan view showing a structure of a conventional standard cell disclosed in Japanese Patent Application Laid Open Publication No. 2002-26125A. Difference of the standard cell shown in FIG. 11 from the standard cell shown in FIG. 10 is that the gate length of the dummy dates 1112, 1119 is larger than that of the other gates and dummy gates. In this example, also, the irregularity in gates and dummy gates is improved to suppress the variation in final gate dimension and the variation in characteristics of the standard cell.

However, in the case where there is irregularity in gate length (for example, some of gates or dummy gates is larger) even with the intervals of the adjacent gates uniformed as described above, final gate dimension varies to cause drive strength of the transistors to vary and to cause the characteristics of the standard cell to vary. None of the aforementioned conventional techniques refers to the case where there is a transistor composing the function of the standard cell that has gate length larger than that of the other transistors, nor to the variation in characteristics of the standard cell to be suppressed in such the case.

Transistors having larger gate length are used for lowering its drive strength in some cases. For example, in a standard cell of a circuit which has an input A and an output Y and which is composed of four inverters 1031 to 1304 as shown in FIG. 12A, the gate length of some gates of the inverters composing the standard cell is set larger for comparatively larger delay between the input A and the output Y. Also, a standard cell of a circuit which has an input A and which is composed of two inverters 1305, 1306 as shown in FIG. 12B has a bus holding function for holding a value of the input A. In this standard cell, the gate length may be set larger for lowering the drive strength of the inverter 1306 that drives the input A. In addition, referring to a standard cell of a flip-flop circuit FF having inputs of a data input D, a scan data input DT, a scan enable signal NT, and a clock signal CK, and outputs of a data output Q and a scan data output SQ, as shown in FIG. 13, there are many cases where the standard cell is connected to another flip-flop for sending/receiving scan data, which is liable to cause hold time violation. In order to restrain the hold time violation, a delay in taking data from the scan data input DT or in outputting data to the scan data output SQ is increased by increasing the gate length of transistors connected to the scan data input DT and the scan data output SQ in some cases.

Moreover, a size of a standard cell is defined by an integral multiple of a unit length (grid), in general. In this case, the width of the standard cell must be an integral multiple of the grid and this may cause the gate length of dummy gates provided on the edge of the standard cell to be different from that of the other gates. For example, if the width of the conventional standard cell 1000 shown in FIG. 10 is not in an integral multiple of the grid, it is necessary to increase the width of the standard cell to an integral multiple by increasing the gate length of the dummy gates 1008, 1015, 1014, and 1021. If the dummy gates on the edge of the standard cell are shared among adjacent standard cells, variation in final dimension is caused in the gate of the transistor in the adjacent standard cell adjacent to the dummy gates to cause variation in drive strength of the transistors, causing variation in characteristics of the standard cell.

SUMMARY OF THE INVENTION

The present invention has its object of suppressing variation in characteristics of a standard cell even with irregularity in gate length of gates or dummy gates.

A first standard cell according to the present invention includes: a plurality of transistors each having a diffusion region and a gate, wherein the plurality of transistors include: at least one first transistor having larger gate length than the other transistors; and at least one second transistor adjacent to the first transistor and sharing a diffusion region with the first transistor, and wherein the second transistor is in an OFF state.

With this arrangement, the transistor in the OFF state that does not contribute to the operation of the standard cell shares the diffusion region to and is adjacent to the transistor having larger gate length, with a result that variation in characteristics of the standard cell is suppressed even if the cell includes a transistor having a larger gate length.

In the first standard cell, the first transistor preferably has the second transistor on both adjacent sides. In this case, the variation in characteristics is suppressed more.

Further, the gates of the plurality of transistors may be arranged with same spacings. With this arrangement, variation in characteristics of the standard cell which is caused due not only to irregularity in gate length but also to irregularity in gate intervals can be suppressed.

A second standard cell according to the present invention includes: a plurality of transistors each having a diffusion region and a gate, wherein the plurality of transistors include: at least one first transistor having larger gate length than the other transistors; and at least one second transistor adjacent to the first transistor and having a diffusion region apart from a diffusion region of the first transistor, and wherein a dummy gate is provided between the first transistor and the second transistor.

In this standard cell, the dummy gate that does not contribute to the operation of the standard cell is adjacent to the transistor having larger gate length, which in turn suppresses the variation in characteristics of the standard cell even if the cell includes a transistor having a larger gate length.

In the second standard cell, the first transistor may have the second transistor on both adjacent sides. In this case, the variation in characteristics is suppressed more.

The gates of the plurality of transistors and the dummy gate may be arranged with the same spacings. With this arrangement, variation in characteristics of the standard cell which is caused due not only to irregularity in gate length but also to irregularity in gate intervals can be suppressed.

A third standard cell according to the present invention includes: a plurality of transistors each having a diffusion region and a gate, wherein the plurality of transistors include: at least one first transistor having larger gate length than the other transistors; and at least one second transistor adjacent to the first transistor and sharing a diffusion region with the first transistor, and wherein a source and a drain of the second transistor are connected to a power source or are grounded.

In this standard cell, the transistor that does not contribute to the operation of the standard cell of which source and drain are both connected to the power source or are both grounded is adjacent to the transistor having larger gate length, which suppresses variation in characteristics of the standard cell even if the cell includes a transistor having a larger gate length.

In the third standard cell, the second transistor may be in an ON state. In this case, the transistor functions as a capacitor to effect noise reduction in the power source.

A fourth standard cell according to the present invention includes: a plurality of transistors each having a diffusion region, a gate, and at least one intra-cell dummy gate on a side of the standard cell, wherein the plurality of transistors include: at least one first transistor adjacent to the intra-cell dummy gate, wherein the first transistor is in an OFF state.

The gate length of the intra-cell dummy gate is determined by the dummy gate provided on the edge of the standard cell and the dummy gate provided on the edge of the adjacent cell. If the thus determined length of the intra-cell dummy gate is different from the gate length of the gates in the adjacent standard cell, the characteristics of the gate adjacent to the intra-cell dummy gate varies from the characteristics of the other gates. In the present invention, however, the transistor in the OFF state that does not contribute to the operation of the standard cell is adjacent to the intra-cell dummy gate, suppressing the variation in characteristic of the standard cell.

In fourth standard cell, it is possible that the intra-cell dummy gate has the first transistor on an adjacent side. In this case, the variation in characteristics is suppressed more.

A fifth standard cell according to the present invention includes: a plurality of transistors each having a diffusion region, a gate, and at least one inter-cell dummy gate on a side of a standard cell, wherein the plurality of transistors include: at least one first transistor adjacent to the intra-cell dummy gate, and wherein a source and a drain of the first transistor are connected to a power source or are grounded.

The gate length of the intra-cell dummy gate is determined by the dummy gate provided on the edge of the standard cell and the dummy gate provided on the edge of the adjacent cell. If the thus determined length of the dummy gate is different from the gate length of the gates in the adjacent standard cell, the characteristics of the gate adjacent to the intra-cell dummy gate varies from the characteristics of the other gates. In the present invention, however, the transistor that does not contribute to the operation of the standard cell is adjacent to the intra-cell dummy gate, suppressing the variation in characteristics of the standard cell.

In the fifth standard cell, it is possible that the first transistor is the transistor adjacent to the intra-cell dummy gate. In this case, the variation in characteristics is suppressed more.

Further, the first transistor may be in an ON state. In this case, each first transistor functions as a capacitor to effect noise reduction in the power source.

Moreover, the intra-cell dummy gate preferably has larger gate length than the transistors.

Furthermore, the gates of the plurality of transistors and the intra-cell dummy gate may be arranged with same spacings. With this arrangement, variation in characteristics of the standard cell which is caused due to not only irregularity in gate length but also to irregularity in gate intervals can be suppressed.

A sixth standard cell according to the present invention includes: a plurality of transistors each having a diffusion region and a gate, wherein the plurality of transistors include: at least one first transistor having larger gate length than the other transistors; at least one second transistor adjacent to the first transistor and sharing a diffusion region with the first transistor; and at least one third transistor adjacent to the first transistor and having a different diffusion region apart from a diffusion region of the first transistor, wherein variation in gate dimension of the second transistor less affects characteristics of the standard cell than that of the third transistor.

With this standard cell, variation in size of the transistor which shares the diffusion region with the adjacent transistor having larger gate length less affects the characteristics of the standard cell to suppress variation in characteristic of the standard cell.

In the sixth standard cell, the first transistor preferably has the second transistor on both adjacent sides.

Also, the second transistor preferably does not drive an output pin directly. With this arrangement, variation in characteristics of the standard cell in a case with variation in transistor size of the second transistor can be suppressed compared with the case where the second transistor is used for driving an output pin.

Further, it is possible that the sixth standard cell includes a feedback section.

With this arrangement, variation in characteristics of the standard cell including the transistor composing feedback with the larger gate length can be suppressed.

Moreover, the standard cell may have a bus holding function or a flip-flop function. In this case, variation in characteristic of the standard cell having a bus holding function or a flip-flop function and including the transistor with larger gate length can be suppressed.

In a standard cell library including at least one standard cell according to any one of the first to sixth invention, variation in characteristics is suppressed.

In a semiconductor integrated circuit including at least one standard cell according to any one of the first to sixth invention, variation in characteristics is suppressed.

In a standard cell library including a plurality of standard cells including a plurality of transistors each having a diffusion region and a gate, among the plurality of standard cell, any standard cell including a transistor having larger gate length than the other transistors is any one of the standard cells of the first to sixth invention.

In a semiconductor integrated circuit including a plurality of standard cells including a plurality of transistors each having a diffusion region and a gate, among the plurality of standard cell, any standard cell including a transistor having larger gate length than the other transistors is any one of the standard cells of the first to sixth invention.

DESCRIPTION OF THE PREFERRED EMBODIMENTS

Preferred embodiments of the present invention will be described below with reference to the drawings.

First Embodiment

Figure 1:
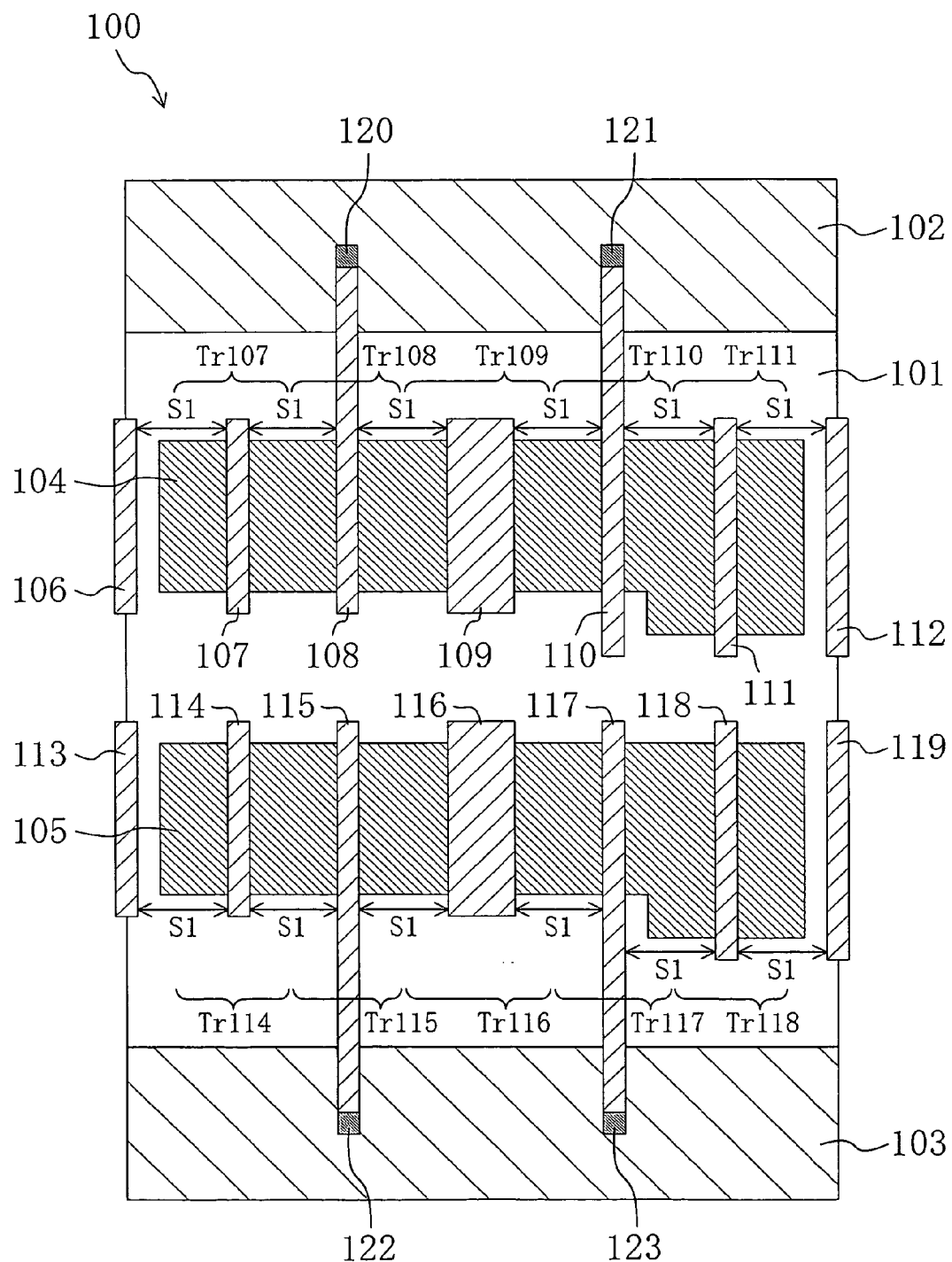
FIG. 1 is a plan view showing a standard cell according to a first embodiment of the present invention.

FIG. 1 is a plan view showing a standard cell according to the first embodiment of the present invention. As shown in FIG. 1, a standard cell 100 of the present embodiment includes: a semiconductor layer 101; a source wiring 102 provided at one end of the semiconductor layer 101; a ground wiring 103 provided at one end opposite the source wiring 102 of the semiconductor layer 101; a p-type diffusion region 104 provided in a region located between the source wiring 102 and the ground wiring 103 in the semiconductor layer 101; a n-type diffusion region 105 provided in a region other than the p-type diffusion region 104 in the semiconductor layer 101; gates 107 to 111 provided on the p-type diffusion region 104 at a spacing S1 from each other; gates 114 to 118 provided on the n-type diffusion region 105 at the spacing S1 from each other; dummy gates 106, 112 provided on both the sides of the p-type diffusion region 104 in the semiconductor layer 101 with the spacing S1 from the gates 107, 111, respectively; and dummy gates 113, 119 provided on parts on both the sides of the n-type diffusion region 105 in the semiconductor layer 101 with the spacing S1 from the gates 114, 118, respectively.

The gates 107 to 111 compose p-channel transistors Tr107 to Tr111, respectively, in combination with the p-type diffusion region 104 while the gates 114 to 118 compose n-channel transistors Tr114 to Tr118, respectively, in combination with the n-type diffusion region 105.

The gates 107 to 111 are provided with the spacing S1 apart from each other and the dummy gates 106, 112 are provided with the spacing S1 apart from the gates 107, 111, respectively, so that the gates 107 to 111 and the dummy gates 106, 112 are arranged at regular intervals. The gates 114 to 118 and the dummy gates 113, 119 are arranged at regular intervals, as well.

Out of the gates, the gate length of the gates 109, 116 is set larger than that of the other gates. The gates 108, 110 provided on the respective sides of the gate 109 extend to the source wiring 102 to be connected to the source wiring 102 through contact vias 120, 121, respectively, being fixed to the source potential. On the other hand, the gates 115, 117 provided on the respective sides of the gate 116 extend to the ground wiring 103 to be connected to the ground wiring 103 through contact vias 122, 123, respectively, being fixed to the ground potential. In addition to the elements shown in the drawing, contact vias for connecting a diffusion region, a wiring layer, the wirings, and a substrate, an inter-cell wiring, input/output pins, and the like are provided in the standard cell 100 but are not shown in the drawing (the same is applied to the second and following embodiments).

Operation of the standard cell 100 structured as above in the first embodiment will be described below. The standard cell 100 includes the gates 109, 116 having larger gate length than the other gates (gates 107, 114, and the like). The irregularity in gate length in the standard cell 100 yields variation in final gate dimension of the gates 108, 110, 115, 117 adjacent to the gates 109, 116. In the present embodiment, however, the potential of the gate terminals of the gate 108, 110, 115, 117 is fixed to allow the transistors Tr108, Tr110, Tr115, Tr117 to be in the OFF state. Even if the final dimension of the gates 108, 110, 115, 117 vary, possible variation in drive strength of the transistors Tr108, Tr110, Tr115, Tr117 does not affect characteristics of the standard cell 100 because the transistors Tr108, Tr110, Tr115, Tr117 do not contribute to the operation of the standard cell 100. Moreover, the provision of the dummy gates 106, 112, 113, 119 enables the gates to be arranged on the respective sides of all the gates that affect the characteristics of the standard cell 100 at regular intervals, further suppressing the variation in characteristics.

It is noted that the present embodiment describes the standard cell with one p-channel transistor and one n-channel transistor each having larger gate length, but the number of transistors having larger gate length may be any number at least one. The present invention is applicable to the case where gate length of a gate is smaller than that of others, in addition to the case where gate length of a gate is larger than that of others.

Further, the present embodiment describes the case where the transistors on the respective sides of the transistor having larger gate length are all in the OFF state, but it is enough to set at least one of them to be in the OFF state. In this case, the number of transistors that affect the characteristics of the standard cell, which is caused due to variation in drive strength, can be reduced compared with conventional one.

Moreover, in the present embodiment, the gates adjacent to the gate having gate length different from that of the others are set to be in the OFF state and the dummy gates 106, 112, 113, and 119 are provided beside the transistors located on the respective sides of the p-type diffusion region 104 and the n-type diffusion region 105, respectively. However, it is unnecessary to provide the dummy gates 106, 112, 113, 119, or the dummy gates 106, 112, 113, 119 may be arranged with a spacing different from the spacing S1 from the gates 107, 111, 114, 118 on the sides of the p-type diffusion region 104 and the n-type diffusion region 105, respectively. In these cases, also, variation in characteristics of the standard cell caused due to irregularity in gate length can be suppressed.

Second Embodiment

Figure 2:
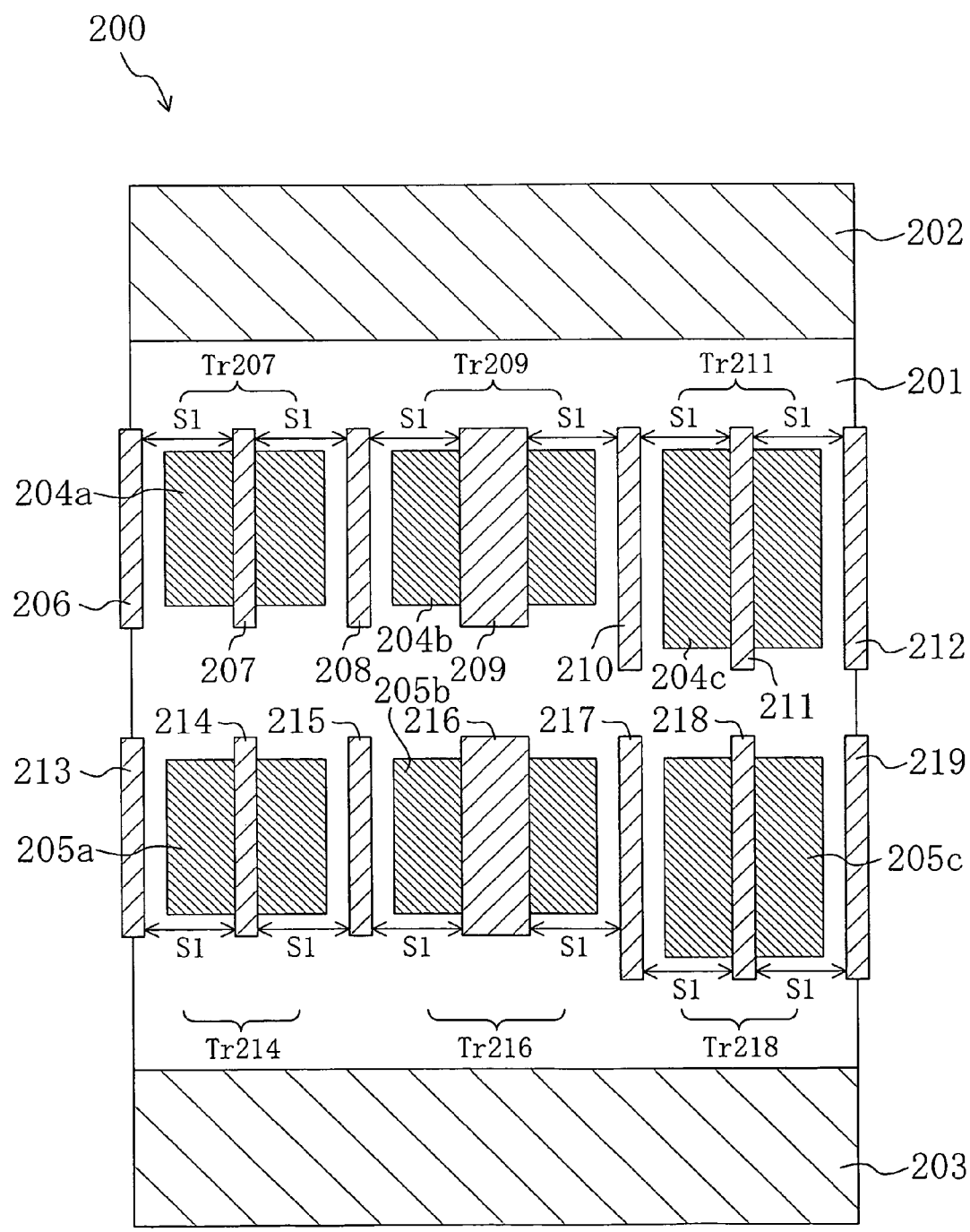
FIG. 2 is a plan view showing a standard cell according to a second embodiment of the present invention.

FIG. 2 is a plan view showing a standard cell of a second embodiment of the present invention. As shown in FIG. 2. a standard cell 200 of the present embodiment includes: a semiconductor layer 201; a source wiring 202 provided at one end of the semiconductor layer 201; a ground wiring 203 provided at one end opposite the source wiring 202 of the semiconductor layer 201; p-type diffusion regions 204a, 204b, 204c provided in regions located between the source wiring 202 and the ground wiring 203 in the semiconductor layer 201, respectively; n-type diffusion regions 205a, 205b, 205c provided in regions other than the p-type diffusion regions 204a, 204b, 204c in the semiconductor layer 201, respectively; gates 207, 209, 211 provided on the p-type diffusion regions 204a, 204b, 204c, respectively; gates 214, 216, 218 provided on the n-type diffusion regions 205a, 205b, 205c, respectively; dummy gates 206, 208, 210, 212 provided between or on one side of the p-type diffusion regions 204a, 204b, 205c in the semiconductor layer 201, respectively; and dummy gates 213, 215, 217, 219 provided between or on one side of the n-type diffusion regions 205a, 205b, 205c in the semiconductor layer 201, respectively.

The gates 207, 209, 211 and the p-type diffusion regions 204a, 204b, 204c compose p-channel transistors Tr207, Tr209, Tr211, respectively, while the gates 214, 216, 218 and the n-type diffusion regions 205a, 205b, 205c compose n-channel transistors Tr214, Tr216, Tr218.

The gate length of the gates 209, 216 is set larger than that of the other gates. The dummy gate 206, the gate 207, the dummy gate 208, the gate 209, the dummy gate 210, the date 211, and the dummy gate 212 are arranged in this order with a spacing S1 from each other. Similarly, the dummy gate 213, the gate 214, the dummy gate 215, the gate 216, the dummy gate 217, the gate 218, and the dummy gate 219 are arranged in this order with the spacing S1 from each other.

Operation of the standard cell structured as above in the second embodiment will be described below. The standard cell 200 includes the gate 209, 216 having larger gate length than that of the other gates. The irregularity in gate length in the standard cell 200 yields variation in final gate dimension of the gates adjacent to the gates 209, 216. In the present embodiment, however, the gate 209 is interposed between the dummy gates 208 and 210 while the gate 216 is interposed between the dummy gates 215 and 217, and accordingly, possible variation in final dimension of the dummy gates 208, 210, 215, 217, that do not contribute to the operation of the standard cell, does not affect the characteristics of the standard cell 200. Further, the provision of the dummy gates 206, 212, 213, 219 enables the gates to be arranged on the respective sides of all the gates that affect the characteristics of the standard cell 200 at regular spacings, further suppressing the variation in characteristics.

It is noted that the present embodiment describes the standard cell with one p-channel transistor and one n-channel transistor each having larger gate length, but the number of transistors having larger gate length may be any number at least one. The present invention is applicable to the case where gate length of a gate is smaller than that of others, in addition to the case where gate length of a gate is larger than that of others.

In the present embodiment, all the gates on both the sides of the transistors having larger gate length are as dummy gates, but a gate on only one side may be a dummy gate. In this case, no variation in drive strength of the transistor is caused on the side where the dummy gate is provided, less affecting the characteristics of the standard cell 200.

In addition, in the present embodiment, it is unnecessary to provide the dummy gates 206 and 212, and 216 and 219, or it is possible that the dummy gates 206, 212, 216, 219 are arranged with a spacing different from the spacing S1 from the gates 207, 211, 214, 218, respectively. In these cases, also, the variation in characteristics of the standard cell caused due to irregularity in gate length can be suppressed.

Third Embodiment

Figure 3:
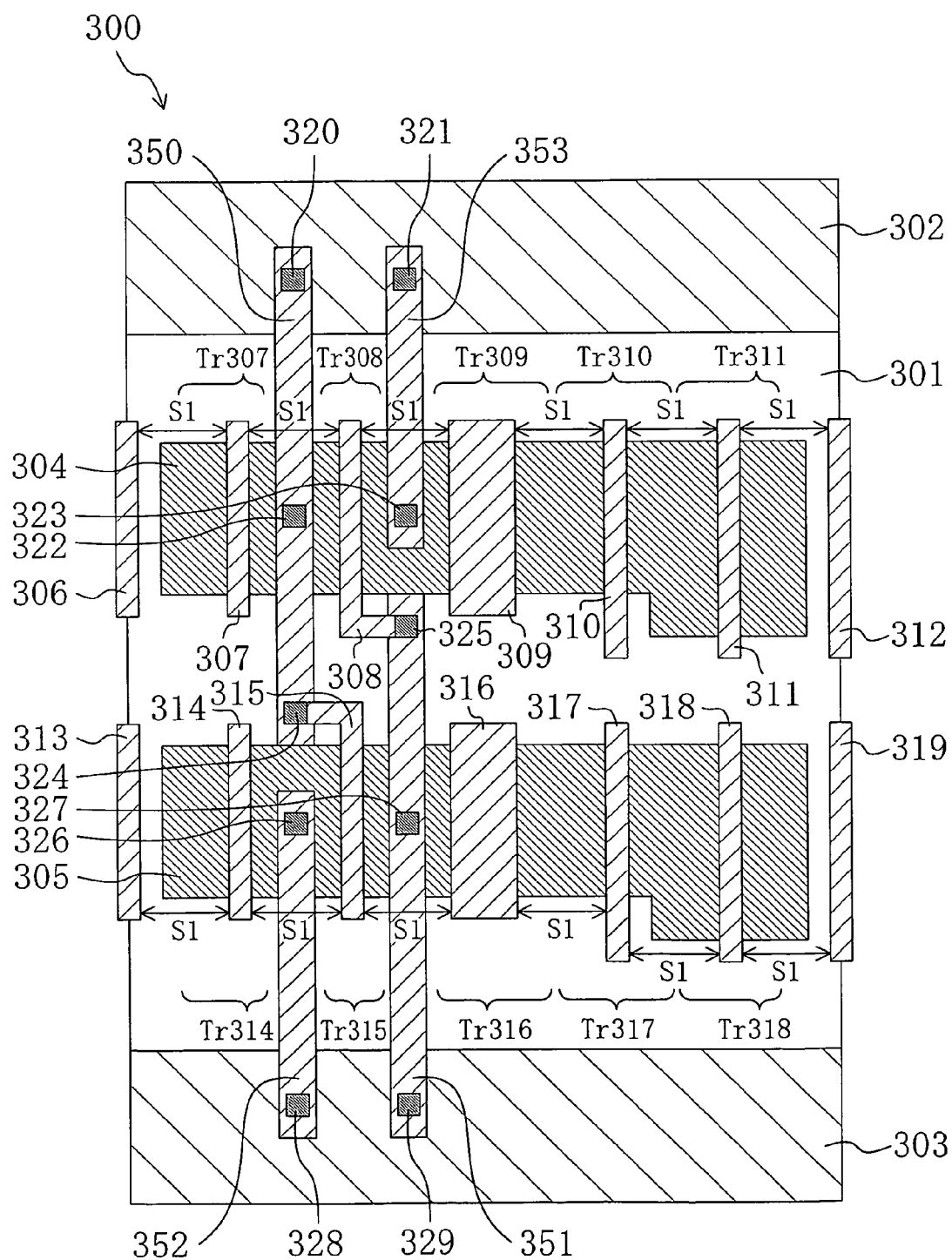
FIG. 3 is a plan view showing a standard cell according to a third embodiment of the present invention.

FIG. 3 is a plan view of a standard cell according to a third embodiment of the present invention. As shown in FIG. 3, a standard cell 300 of the present embodiment includes: a semiconductor layer 301; a source wiring 302 provided at one end of the semiconductor layer 301; a ground wiring 303 provided at one end opposite the source wiring 302 of the semiconductor layer 301; a p-type diffusion region 304 provided in a region located between the source wiring 202 and the ground wiring 303 in the semiconductor layer 301; a n-type diffusion region 305 provided in a region other than the p-type diffusion region 304 in the semiconductor layer 301; gates 307 to 311 provided apart from each other on the p-type diffusion region 304; gates 314 to 318 provided apart from each other on the n-type diffusion region 305; dummy gates 306, 312 provided on parts on the sides of the p-type diffusion region 304 in the semiconductor layer 301 with a spacing S1 from the gates 307, 311, respectively; dummy gates 313, 319 provided on parts on the sides of the n-type diffusion region 305 in the semiconductor layer 301 with the spacing S1 from the gates 314, 318, respectively; contact vias 320, 321 in contact with the source wiring 302; contact vias 322, 323 in contact with a source region and a drain region of a transistor Tr308 having the gate 308; contact vias 326, 327 in contact with a source region and a drain region of a transistor Tr315 having the gate 315; contact vias 328, 329 in contact with the ground wiring 303; a contact via 325 in contact with the gate 308; a contact via 324 in contact with the gate 315; a wiring 350 that connects the contact vias 320, 322, 324; a wiring 351 that connects contact vias 325, 327, 329; a wiring 352 that connects the contact vias 326, 328; and a wiring that connects the contact vias 321, 323.

The gate length of the gates 309, 316 is larger than that of the other gates. The dummy gate 306, the gates 307 to 311 and the dummy gate 312 are arranged in this order with the spacing S1 from each other. Similarly, the dummy gate 313, the gates 314 to 318, and the dummy gate 319 are arranged in this order with the spacing S1 from each other.

With the contact vias 320 to 329 and the wirings 350 to 353, the source and the drain of the transistor Tr308 and the gate 315 of the transistor Tr315 are connected to the source wiring 302 electrically, and the gate 308 of the transistor Tr308 and the source and the drain of the transistor Tr315 are connected to the ground wiring 303 electrically.

Operation of the standard cell structured as above in the third embodiment will be described below. The standard cell 300 includes the gate 309, 316 having larger gate length than that of the other gates. The irregularity in gate length in the standard cell 300 yields variation in final gate dimension of the gates adjacent to the gates 309, 316. In the present embodiment, however, both the sources and the drains of the transistors Tr308, Tr315 adjacent to the gates 309, 316 are fixed to the source potential or the ground potential, and accordingly, possible variation in final dimension of the transistors Tr308, Tr315, which do not contribute to the operation of the standard cell 300, does not affect characteristics of the standard cell 300. Further, the p-channel transistor Tr308 has the source and the drain fixed to the source potential and the gate 308 fixed to the ground potential, functioning as a capacitor to exhibit an effect of suppressing fluctuation of the source potential. The provision of the dummy gates 306, 312, 313, 319 enables the gate to be arranged at the respective sides of all the gates that affects the characteristics of the standard cell 300 at regular spacings, further suppressing the variation in characteristics.

It should be noted that the present embodiment describes the case with one p-channel transistor and one n-channel transistor each having larger gate length, but the number of transistors having larger gate length may be any number at least one. The present invention is applicable to the case where gate length of a gate is smaller than that of others, in addition to the case where gate length of a gate is larger than that of others.

Also, in the present embodiment, only the sources and the drains of the transistors Tr308, Tr315 are fixed out of the transistors Tr308, Tr310, Tr315, Tr317 respectively having the gates 308, 310, 315, 317 provided on the respective sides of the gates 309, 316 having larger gate length. However, the effect of suppressing the variation in characteristics of the standard cell can be obtained by fixing the source and the drain of at least one of them.

Further, in the present embodiment, the source and the drain are fixed to the source potential and the gate is fixed to the ground potential so that the p-channel transistor can function as a capacitor. However, it is possible to fix the source and the drain to the ground potential and fixed the gate to the source potential. The effect of suppressing the variation in characteristic of the standard cell can be obtained also in this case.

In the present embodiment, it is possible to set the p-channel transistor Tr308 and the n-channel transistor Tr315 to be in the OFF state. The effect of suppressing the variation in characteristic of the standard cell can be obtained also in this case.

In addition, in the present embodiment, it is unnecessary to provide the dummy gates 306, 312, 313, 319, or it is possible that the dummy gates 306, 312, 313, 319 are arranged with a spacing different from the spacing S1 from the gates 307, 311, 314, 318 located on the sides of the p-type diffusion region 304 and the n-type diffusion region 305, respectively. In these cases, also, variation in characteristics of the standard cell caused due to irregularity in gate length can be suppressed.

Fourth Embodiment

Figure 4:
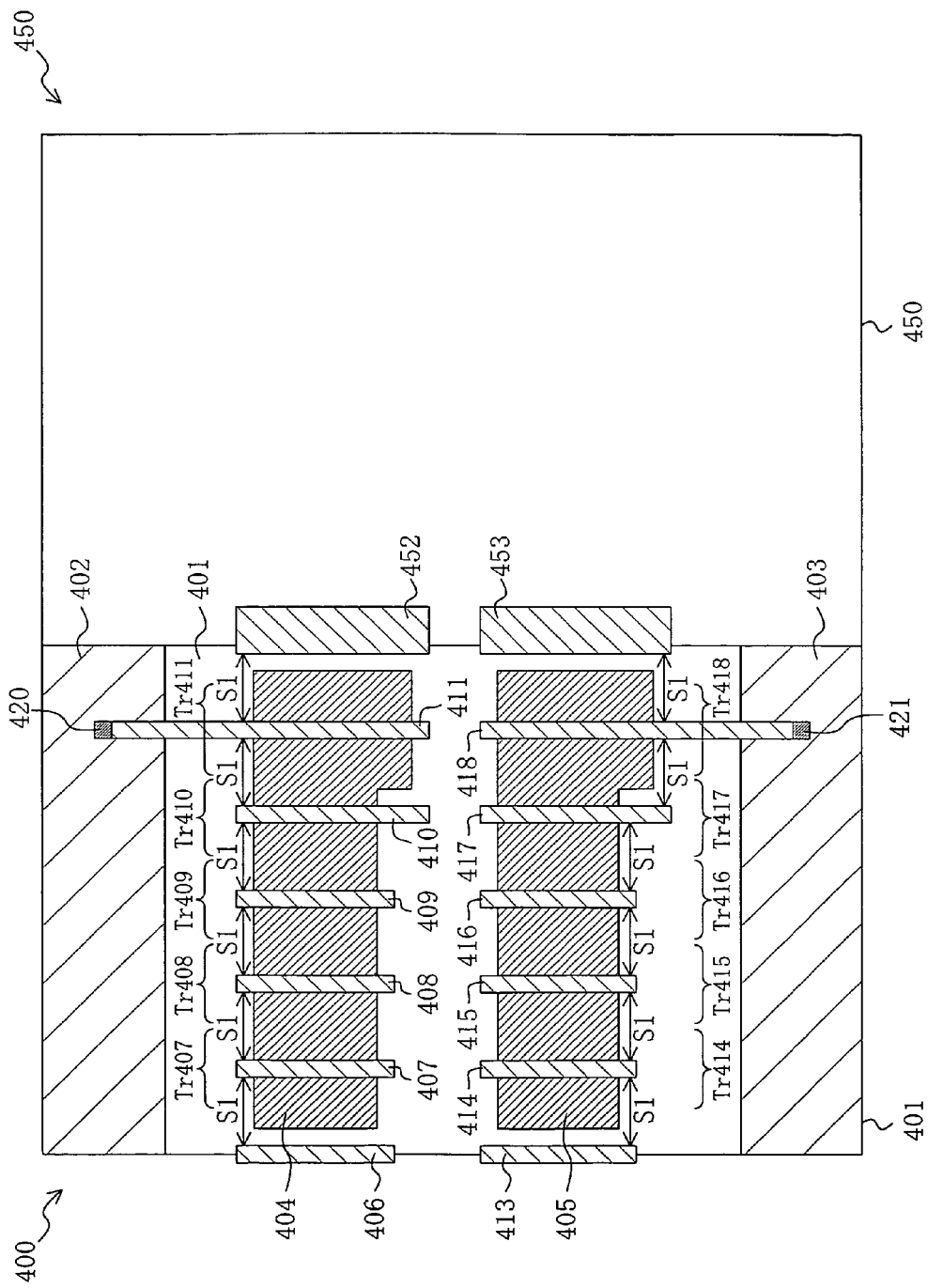
FIG. 4 is a plan view showing a standard cell according to a fourth embodiment of the present invention.

FIG. 4 is a plan view of a standard cell according to a fourth embodiment of the present invention. As shown in FIG. 4, another standard cell 450 is provided beside a standard cell 400 of the present embodiment. Dummy gates 452, 453 located on the boundary between the standard cells 400, 450 are dummy gates constituted by overlaying dummy gates located on the boundary on the right side of the standard cell 400 and the dummy gates located on the boundary on the left side of the standard cell 450, respectively, and are shared by the standard cells 400, 450.

The standard cell 400 in the present embodiment includes: a semiconductor layer 401; a source wiring 402 provided on one end of the semiconductor layer 401; a ground wiring 403 provided on the semiconductor layer 401 at a distance apart from the source wiring 402; a p-type diffusion region 404 provided in a region located between the source wiring 402 and the ground wiring 403 in the semiconductor layer 401; a n-type diffusion region 405 provided in a region other than the p-type diffusion region 404 in the semiconductor layer 401; gates 407 to 411 provided on the p-type diffusion region 404 provided apart from each other; gates 414 to 418 provided on the n-type diffusion region 405 provided apart from each other; dummy gates 406, 452 provided on the respective sides of the p-type diffusion region 404 in the semiconductor layer 401 with a spacing S1 from the gates 407, 411, respectively; dummy gates 413, 453 provided on the respective sides of the n-type diffusion region 405 in the semiconductor layer 401 with the spacing S1 from the gates 414, 418, respectively; a contact via 420 that connects the gate 411 to the source wiring 402 electrically; and a contact via 421 that connects the gate 418 to the ground wiring 403 electrically.

The gates 407 to 411 compose p-channel transistors Tr407 to Tr411 in combination with the p-type diffusion region 404, respectively, while the gates 414 to 418 compose n-channel transistors Tr414 to Tr418 in combination with the n-type diffusion region 405, respectively.

The dummy gate 406, the gate 407 to 411, and the dummy gate 452 are arranged in this order with the spacing S1 from each other while the dummy gate 413, the gate 414 to 418, and the dummy gate 453 are arranged in this order with the spacing S1 from each other.

The gate 411 extends to the source wiring 402 further than the other gates 407 to 410 and is connected to the source wiring 402 through the contact via 420 to be fixed to the source potential. On the other hand, the gate 421 extends to the ground wiring 403 further than the other gates 414 to 417 and is connected to the ground wiring 403 through the contact via 421 to be fixed to the ground potential.

The dummy gate located on the boundary on the right side of the standard cell 400 has the same gate length as that of the gates 411, . . . while the dummy gate located on the boundary on the left side of the standard cell 450 has gate length larger than that of the gates 411, . . . , and the dummy gates of the standard cells 400, 450 are overlaid with each other so that the gate length of the dummy gate 452, 453 becomes larger than the gate length of the gates 411, . . . in the standard cell 400. Wherein, transistors having gates provided in the standard cell 450 in addition to the dummy gates 452, 453 are not shown in the drawing.

Operation of the standard cell structured as above in the fourth embodiment will be described below. The dummy gates 452, 453 having gate length larger than that of the gates 411, . . . in the standard cell 400 are provided between the standard cells 400, 450. In this case, final dimension of the gates 411, 418 adjacent to the dummy gates 452, 453 varies. In the present embodiment, however, the gates 411, 418 are fixed to the source potential and the ground potential respectively to set the transistors Tr411, Tr418 to be in the OFF state. Hence, possible variation in gate length of the gates 411, 418 does not affect the characteristics of the standard cell 400. The provision of the dummy gates 406, 413 enables the gates to be arranged on the respective sides of all the gates that affect the characteristics of the standard cell 400 at regular spacings, further suppressing the variation in characteristics.

It should be noted that in the present embodiment, the p-channel transistor Tr411 and the n-channel transistor Tr418 at the right end of the standard cell 400 are in the OFF state, but it is possible to set the p-channel transistors and the n-channel transistors on the respective sides of the standard cell 400 to be in the OFF state or to set any one of the p-channel transistors and the n-channel transistors on the respective sides of the standard cell 400 to be in the OFF state. In these cases, also, effects to the characteristics of the standard cell 400 can be suppressed even with variation in gate length of the transistors in the OFF state.

Further, in the present embodiment, the gates 411, 418 are fixed to the source potential and the ground potential, respectively, but it is possible to fix the source and the drain to the source potential or the ground potential as in the third embodiment. In association therewith, the transistors Tr411, Tr418 may be functioned as capacitors. In this case, the transistors Tr411, Tr418 do not contribute to the operation of the standard cells, suppressing variation in characteristics of the standard cell. When the transistors Tr411, Tr418 function as the capacitors, an effect of suppressing variation in source potential can be exhibited.

In addition, in the present embodiment, it is unnecessary to provide the dummy gates 406, 413. Also, the dummy gates 406, 413 may be provided at spacing different from the spacing S1 from the gates 407, 414 located on the respective sides of the p-type diffusion region 404 and the n-type diffusion region 405, respectively.

Fifth Embodiment

Figure 5:
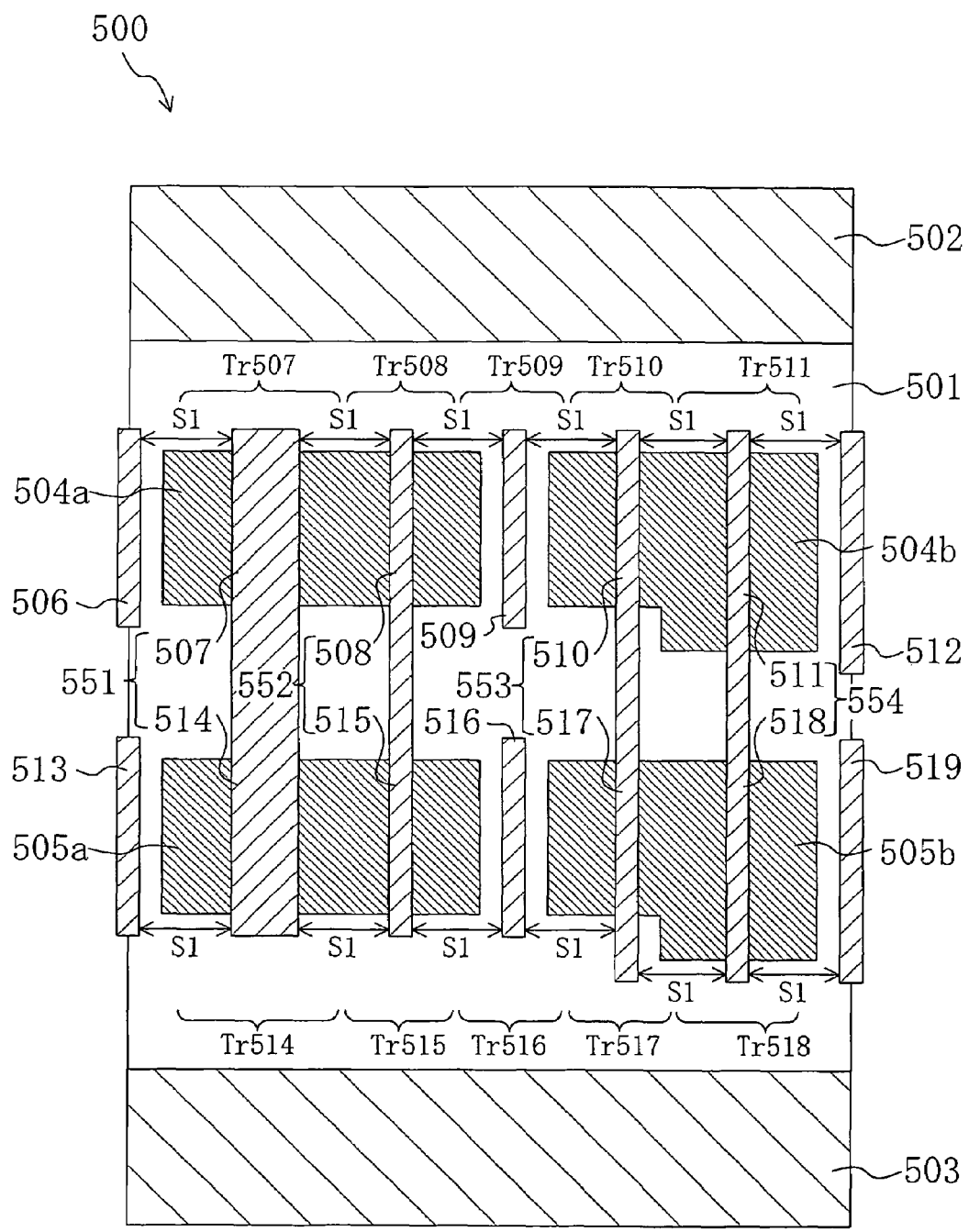
FIG. 5 is a plan view showing a standard cell according to a fifth embodiment of the present invention.

FIG. 5 is a plan view showing a standard cell according to a fifth embodiment of the present invention. A standard cell 500 shown in FIG. 5 composes a circuit of four inverters shown in FIG. 12A, and includes: a semiconductor layer 501; a source wiring 502 provided at one end of the semiconductor layer 501; a ground wiring 503 provided at one end opposite the source wiring 502 of the semiconductor layer 501; p-type diffusion regions 504a, 504b provided in a region located between the source wiring 502 and the ground wiring 503 in the semiconductor layer 501; n-type diffusion regions 505a, 505b provided in a region other than the p-type diffusion regions 504a, 504b in the semiconductor layer 501; conductive films 551, 552 provided over from the p-type diffusion region 504a to the n-type diffusion region 505a; conductive films 553, 554 provided over from the p-type diffusion region 504b to the n-type diffusion region 505b; dummy gates 506, 509, 512 provide on the sides of the p-type diffusion regions 504a, 504b of the semiconductor layer 501, respectively; and dummy gates 513, 516, 519 provided on the sides of the n-type diffusion regions 505a, 505b of the semiconductor layer 501.

The conductive film 551 serves as a gate 507 on the p-type diffusion region 504a and as a gate 514 on the n-type diffusion region 505a while the conductive film 552 serves as a gate 508 on the p-type diffusion region 504a and as a gate 515 on the n-type diffusion region 505a. The conductive film 553 serves as a gate 510 on the p-type diffusion region 504b and as a gate 517 on the n-type diffusion region 505b while the conductive film 554 serves as a gate 511 on the p-type diffusion region 504b and as a gate 518 on the n-type diffusion region 505b. A p-channel transistor Tr507 and a n-channel transistor Tr514 are paired to compose an inverter 1301 in FIG. 12A, a p-channel transistor Tr508 and a n-channel transistor Tr515 are paired to compose the inverter 1302, a p-channel transistor Tr510 and a n-channel transistor Tr517 are paired to compose the inverter 1303, and a p-channel transistor Tr511 and a n-channel transistor Tr518 are paired to compose the inverter 1304.

The dummy gate 506, the gates 507, 508, the dummy gate 509, the gate 510, 511, and the dummy gate 512 are arranged in this order with a spacing S1 from each other while the dummy gate 513, the gates 514, 515, the dummy gate 516, the gates 517, 518, and the dummy gate 519 are arranged in this order with the spacing S1 from each other.

Operation of the standard cell structured as above in the fifth embodiment will be described below. The standard cell 500 has the gates 507, 514 having gate length larger than that of the other gates. The irregularity in gate length in the standard cell 500 yields variation in final gate dimension of the gates 508, 515 adjacent to the gates 507, 514. A characteristic of a transistor for driving an output pin affects the characteristics of a standard cell, especially, a delay characteristic of the standard cell. In the circuit shown in FIG. 12A, the inverter 1304, which directly drives the output pin, corresponds to the p-channel transistor 511 and the n-channel transistor 518 in FIG. 5. Therefore, possible variation in final dimension of the gates 508, 515 less affects the delay characteristic of the standard cell 500. With a transistor having larger gate length than that of the other transistors, variation in characteristics of the standard cell can be suppressed by using a transistor which is located therearound and varies in final gate dimension as a transistor that does not drive the output pin.

It is to be noted that only the transistors Tr508, Tr515 share the p-type diffusion region 504a and the n-type diffusion region 505a with the transistors Tr507, Tr514 having larger gate length than that of the others in the present embodiment, but it is possible to provide transistors on the respective sides of the transistors Tr507, Tr514 to share the p-type diffusion region 504 and the n-type diffusion region 505. In this case, the same effect as above can be obtained when the transistors on the respective sides are used not for driving the output pin.

Figure 12A:
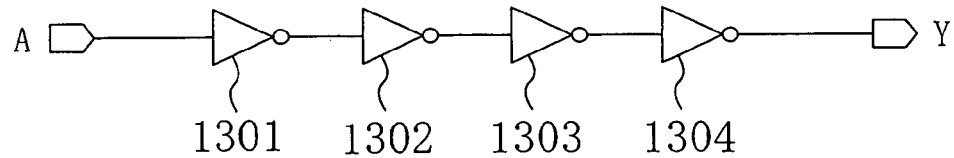
FIG. 12A and FIG. 12B are circuit diagrams showing structures of conventional standard cells.
Figure 12B:
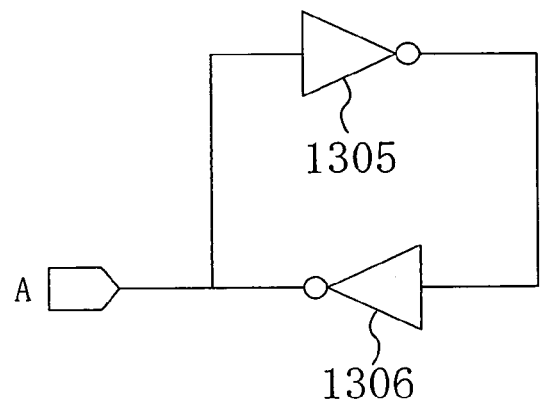

Further, the standard cell composing the circuit shown in FIG. 12A is described in the present embodiment but the present embodiment is applicable to standard cells including an output pin and transistors having different gate length.

The gates and the dummy gates are arranged at regular spacings in the present embodiment but may be arranged at irregular spacings. In this case, also, variation in characteristics of the standard cell caused due to irregularity in gate length can be suppressed.

In the present embodiment, it is unnecessary to provide the dummy gates 506, 509, 512, 513, 516, 519. Also, the dummy gates 506, 512, 513, 519 may be provided at a spacing different from the spacing S1 from the gates 507, 511, 514, 518 located on the respective sides of the p-type diffusion regions 504a, 504b and the n-type diffusion regions 505a, 505b, respectively.

Sixth Embodiment

Figure 6:
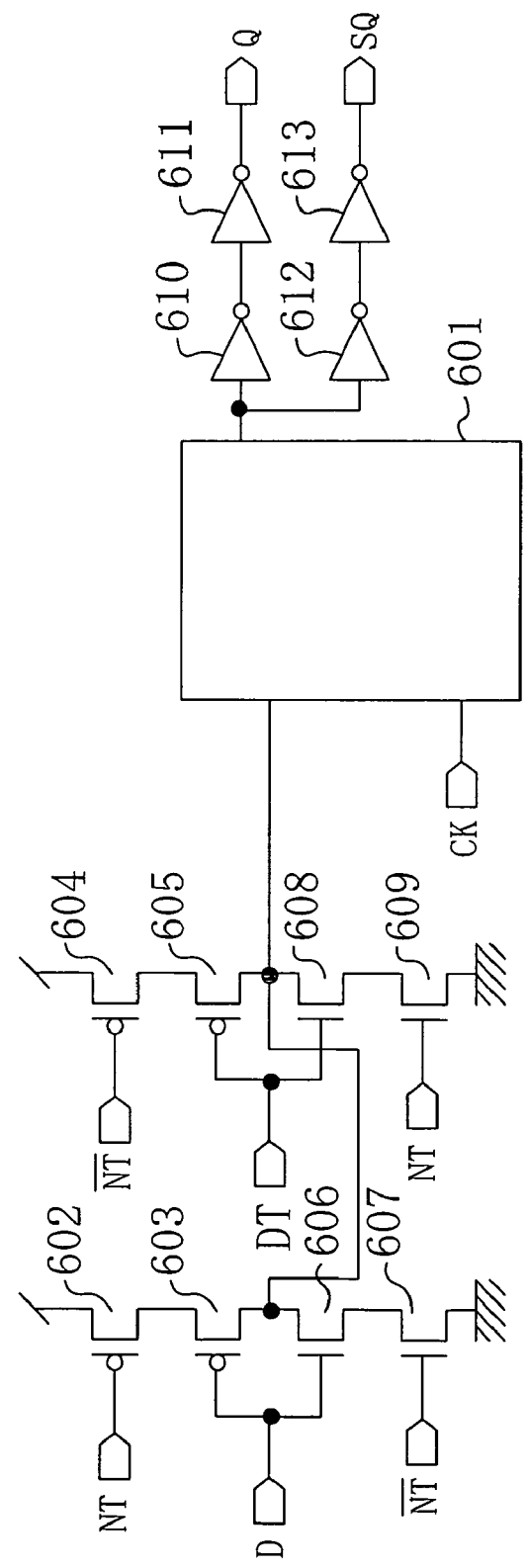
FIG. 6 is a plan view showing a standard cell according to a sixth embodiment of the present invention.
Figure 13:
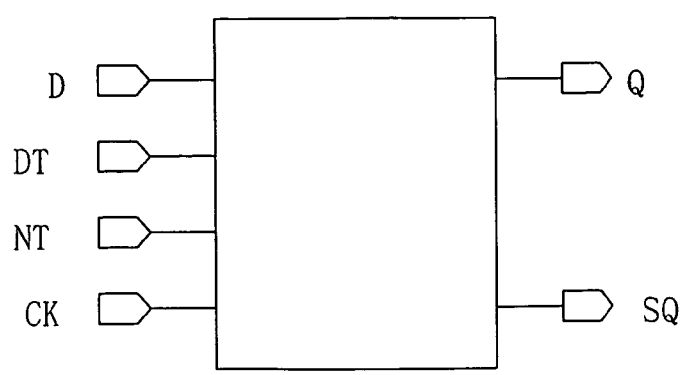
FIG. 13 is a circuit diagram showing a structure of a conventional standard cell.

FIG. 6 is a circuit diagram showing a standard cell according to a sixth embodiment of the present invention. The circuit diagram of FIG. 6 is a circuit diagram illustrating in detail a circuit of a data input section and a data output section of a flip-flop shown in FIG. 13.

The circuit shown in FIG. 6 includes: p-channel transistors 602 to 605; n-channel transistors 606 to 609; a master slave flip-flop 601 of which data input is connected to the drains of the p-channel transistors 603, 605 and the drains of the n-channel transistors 606, 608 and to which a clock signal CK is input as a clock; inverters 610, 612 to which data output of the master slave flip-flop 601 is connected; an inverter 611 that receives an output from the inverter 610 to output a data output Q; and an inverter 613 that receives an output from the inverter 612 to output a scan data signal SQ.

The p-channel transistor 602 receives at its gate a scan enable signal NT, is connected at its source to the power source, and is connected at its drain to the source of the p-channel transistor 603. The drain of the p-channel transistor 603 is connected to the drain of the n-channel transistor 606, and these two transistors 603, 606 receive at their gates a data signal D. The n-channel transistor 607 is connected at its drain to the source of the n-channel transistor 606, is grounded at its source, and receives at its gate an inverted scan enable singal /NT.

The p-channel transistor 604 receives at its gate an inverted scan enable signal /NT, is connected at its source to the power source, and is connected at its drain to the source of the p-channel transistor 605. The drain of the p-channel transistor 605 is connected to the drain of the n-channel transistor 608, and these two transistors 605, 608 receive at their gates a scan data signal DT. The n-channel transistor 609 is connected at its drain to the source of the n-channel transistor 608, is grounded at its source, and receives at its gate a scan enable singal NT.

In the circuit of the present embodiment, through the p-channel transistors 602 to 605 and the n-channel transistors 606 to 609, the scan data input DT is input to the master slave flip-flop 601 when a scan enable signal NT is 1 while the data input D is input to the master slave flip-flop 601 when a scan enable signal NT is 0.

Herein, the gate length of the p-channel transistors 604, 605, the n-channel transistors 608, 609 and the transistors composing the inverter 612 is set larger than that of the other transistors. The p-channel transistors 604, 605, the n-channel transistors 608, 609, and the transistors composing the inverter 612 are arranged so as not to share the diffusion regions with the p-channel transistor 602, 603, the n-channel transistors 606, 607, and the transistors composing the inverters 611, 613, namely, are arranged not so as to be adjacent thereto.

Operation of the standard cell structured as above in the sixth embodiment will be described below. In the standard cell in the present embodiment, the p-channel transistors 604, 605, the n-channel transistors 608, 609, and the transistors composing the inverter 612 have larger gate length than that of the others, which in turn yields variation in final dimension of the gates adjacent to the transistors. Wherein, these transistors are not adjacent to the p-channel transistors 602, 603, the n-channel transistors 606, 607, and the transistors composing the inverters 611, 613 and the diffusion regions are not shared. If the final dimension of the p-channel transistors 602, 603 and the n-channel transistors 606, 607 varies, the variation affects setup time and hold time of the data signal D of the standard cell greatly. While, if the final dimension of the transistors composing the inverters 611, 613 varies, the variation affects the delay characteristic to the data output Q and the scan data output SQ greatly. In the present embodiment, with no variation in final dimension of the transistors (transistors 602, 603, 606, 607, 611, and 613), the characteristics of the standard cell of the present invention are less affected.

Figure 7:
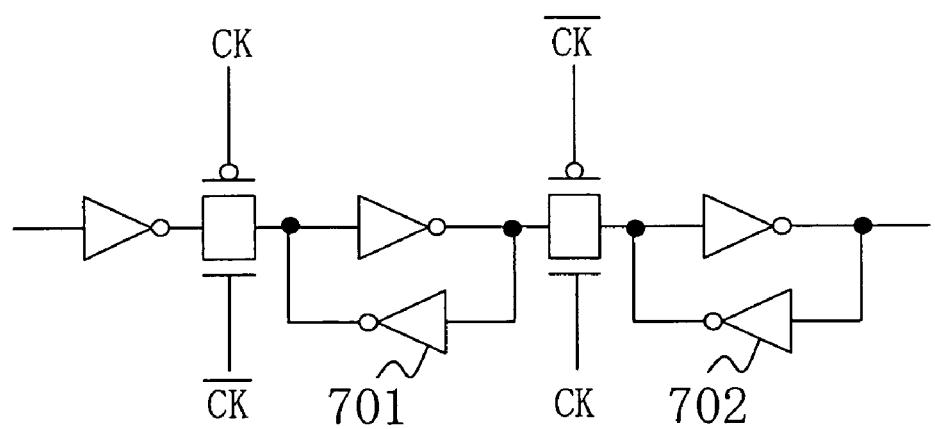
FIG. 7 is a circuit diagram showing an example of a master slave flip-flop in the sixth embodiment.
Figure 8:
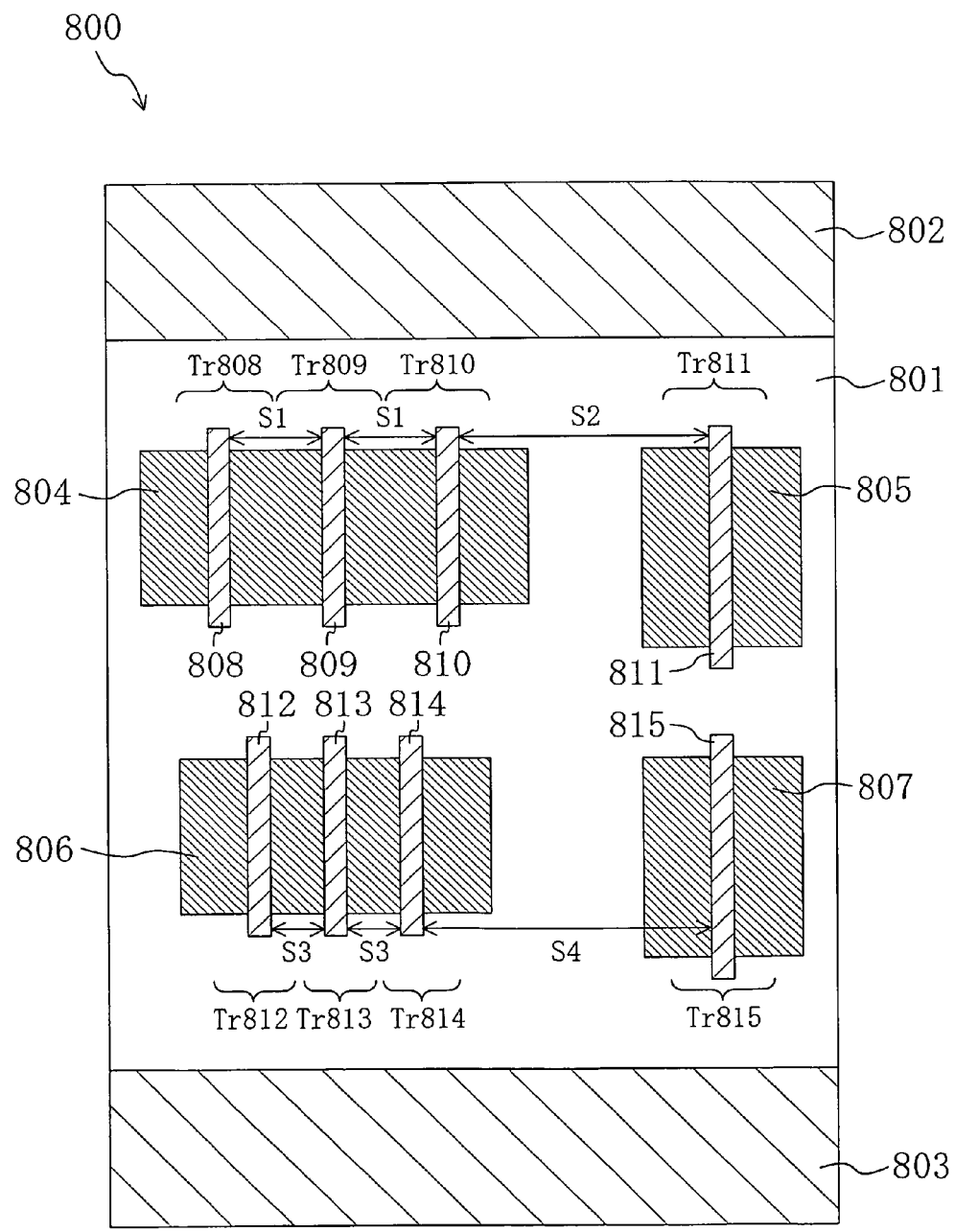
FIG. 8 is a plan view showing one example of a conventional standard cell.
Figure 9:
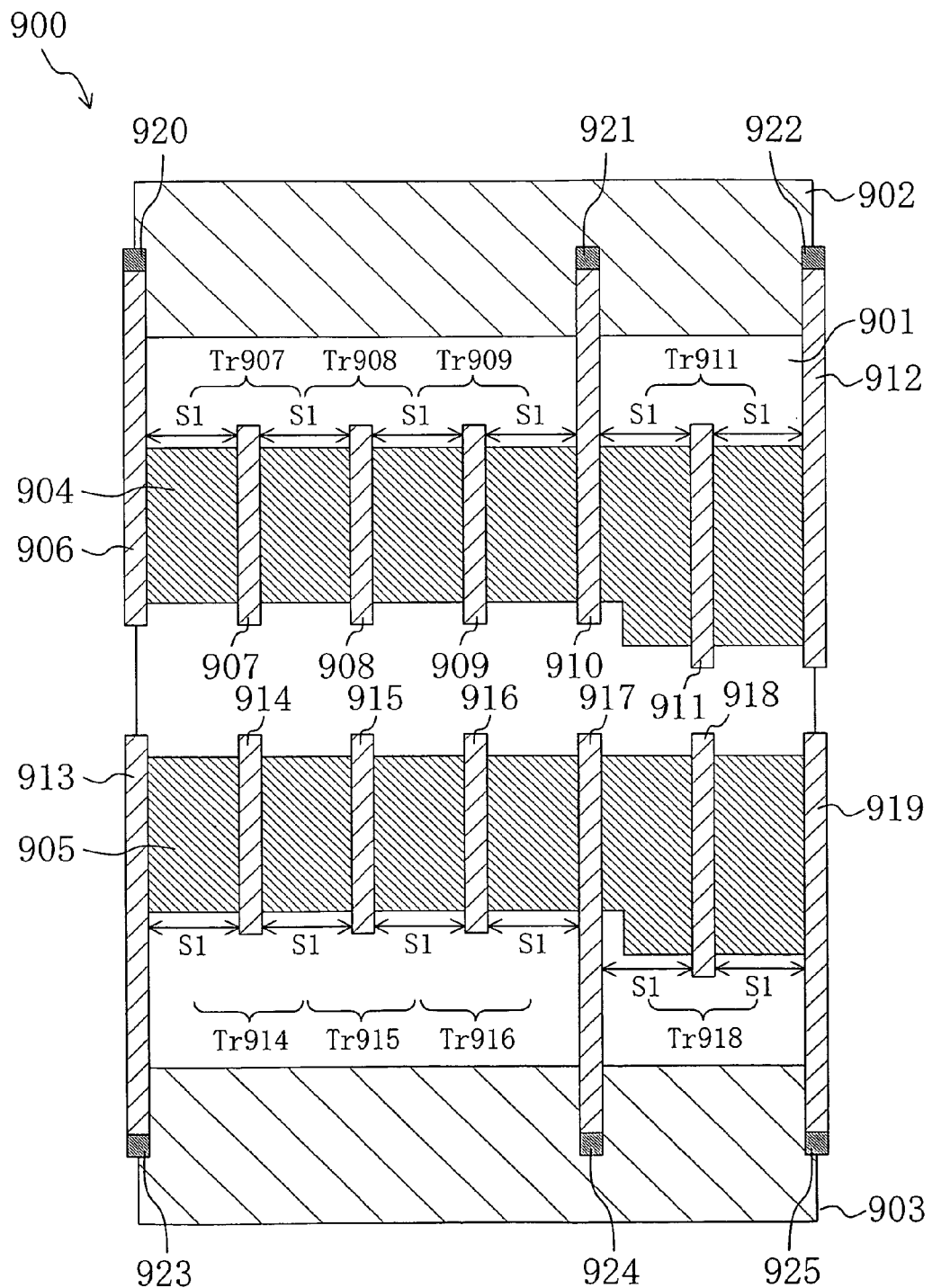
FIG. 9 is a plan view showing a structure of a conventional standard cell disclosed in Japanese Patent Application Laid Open Publication No. 9-289251A.
Figure 10:
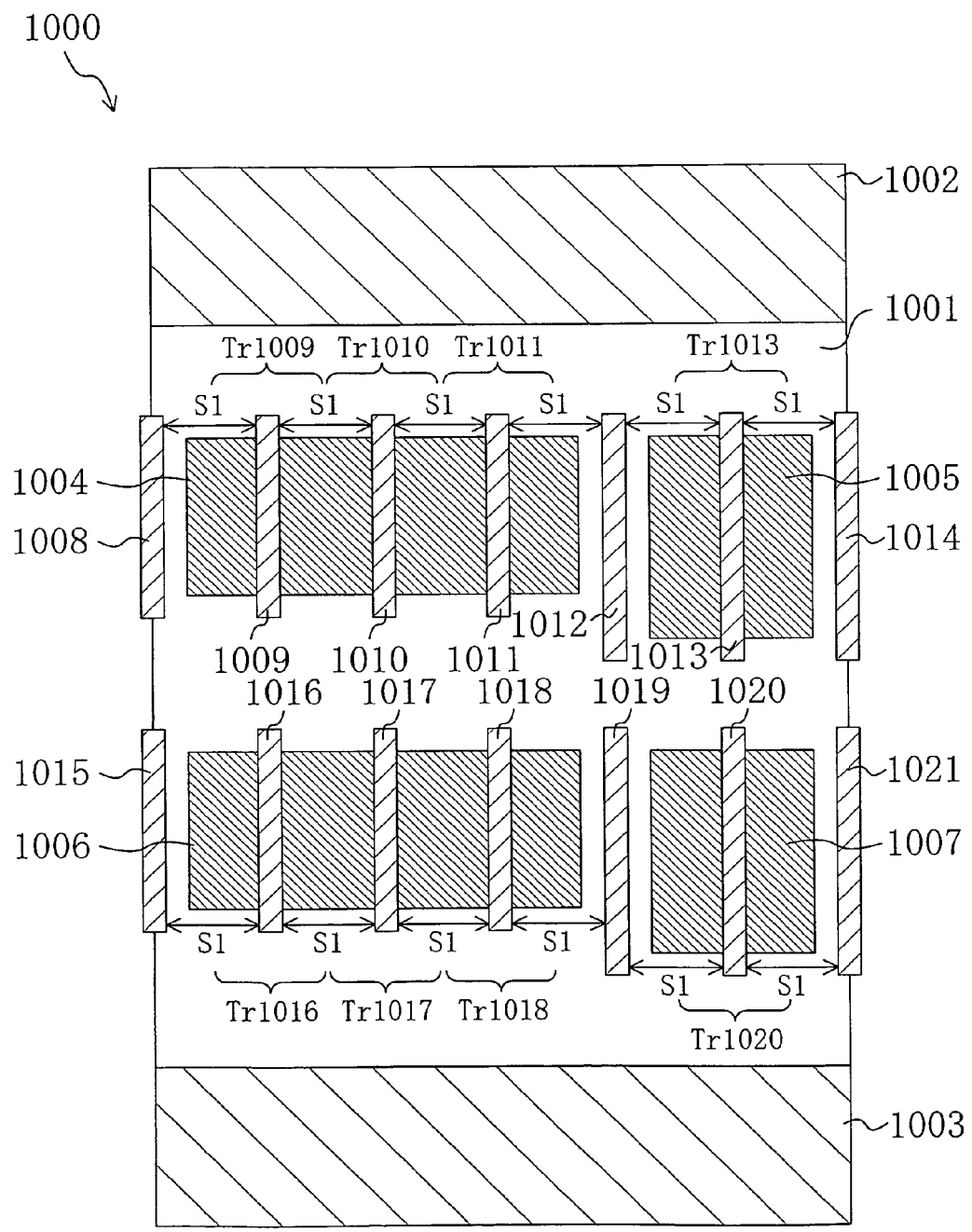
FIG. 10 is a plan view showing a structure of a conventional standard cell disclosed in Japanese Patent Application Laid Open Publication No. 2002-26125A.
Figure 11:
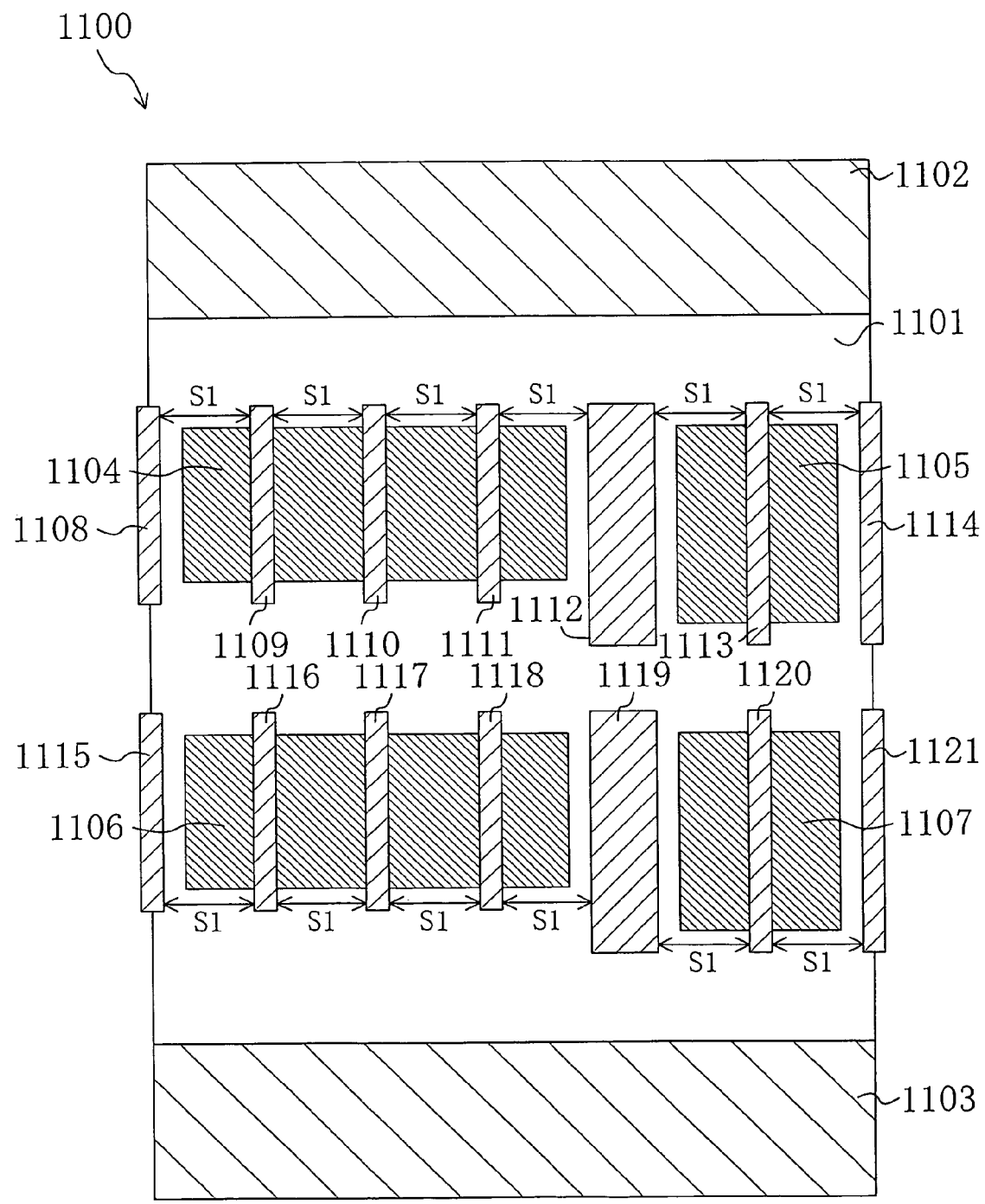
FIG. 11 is a plan view showing a structure of a conventional standard cell disclosed in Japanese Patent Application Laid Open Publication No. 2002-26125A.

In the present invention, the transistors with larger gate length than that of the others in the flip-flop are in the scan data input section and the scan data output section. However, the present invention is applicable to the case where the transistors are used as other sections. For example, FIG. 7 shows an example of a circuit in the master slave flip-flop 601 in FIG. 6. Each inverter 701, 702 in the drawing composes a feedback section in the circuit. The gate length may be set larger for lowering the drive strength of the inverters in some cases, and the present invention can be applied to this case.

It is should be noted that only the standard cells are described in the first to sixth embodiments but it is needless to say that the same effects can be obtained in standard cell libraries and semiconductor integrated circuits which include such standard cells.

What is claimed is:

1. A standard cell having a rectangular shape defined by a first direction and a second direction that is perpendicular to the first direction, the standard cell comprising:
   a plurality of transistors each having a diffusion region and a gate,
   a power supply wiring extended in the first direction,
   wherein the plurality of transistors include:
   at least one first transistor having larger gate length than the other transistors; and
   at least one second transistor adjacent to the first transistor and having a diffusion region apart from a diffusion region of the first transistor, and
   wherein the gate length of the at least one first transistor is defined by a length of gate in the first direction, and
   wherein a dummy gate is provided between the first transistor and the second transistor,
   a source/drain of the first transistor and a source/drain of the second transistor are separated;
   a width of the dummy gate in the first direction is smaller than a distance between the source/drain of the first transistor and the source/drain of the second transistor; and
   the dummy gate is provided in a region between the first and second transistors when viewed in plan view.

2. The standard cell of claim 1, wherein the first transistor has the second transistor on both adjacent sides.

3. The standard cell of claim 1, wherein the gates of the plurality of transistors and the dummy gate are arranged at regular intervals.

4. The standard cell of claim 1, wherein the at least one first transistor includes an n-type first transistor and a p-type first transistor.

5. The standard cell of claim 4,
   wherein the at least one second transistor includes an n-type second transistor and a p-type second transistor,
   wherein a first dummy gate is provided between the n-type first transistor and the n-type second transistor, and
   wherein a second dummy gate is provided between the p-type first transistor and the p-type second transistor.

6. The standard cell of claim 4, wherein the n-type first transistor is opposed to the p-type first transistor.

7. The standard cell of claim 1, wherein the number of the at least one first transistor is more than two.

8. The standard cell of claim 7, wherein the dummy gate is provided adjacent to each one of the first transistors.

9. A standard cell library comprising at least one standard cell according to claim 1.

10. A semiconductor integrated circuit comprising at least one standard cell according to claim 1.

11. A standard cell library comprising a plurality of standard cells including a plurality of transistors each having a diffusion region and a gate, wherein among the plurality of standard cell, any standard cell including a transistor having larger gate length than the other transistors is the standard cell of claim 1.

12. A semiconductor integrated circuit comprising a plurality of standard cells including a plurality of transistors each having a diffusion region and a gate,
wherein among the plurality of standard cell, any standard cell including a transistor having larger gate length than the other transistors is the standard cell of claim 1.

* * * * *